(12) United States Patent
Alini et al.

(10) Patent No.: US 8,188,755 B2
(45) Date of Patent: May 29, 2012

(54) ELECTROSTATIC MEMS DRIVER WITH ON-CHIP CAPACITANCE MEASUREMENT FOR AUTOFOCUS APPLICATIONS

(75) Inventors: Roberto Alini, Dublin, CA (US); Roberto Casiraghi, Milan (IT)

(73) Assignee: Maxim Integrated Products, Inc., Sunnyvale, CA (US)

( * ) Notice: Subject to any disclaimer, the term of this patent is extended or adjusted under 35 U.S.C. 154(b) by 311 days.

(21) Appl. No.: 12/685,992

(22) Filed: Jan. 12, 2010

(65) Prior Publication Data
US 2011/0169509 A1    Jul. 14, 2011

(51) Int. Cl.
*G01R 27/26* (2006.01)

(52) U.S. Cl. ........................... 324/686; 324/457

(58) Field of Classification Search ................. 324/537, 324/686, 713, 457
See application file for complete search history.

(56) References Cited

U.S. PATENT DOCUMENTS

| 4,737,706 A | 4/1988 | Eilersen |
| 6,275,047 B1 | 8/2001 | Zoellick et al. |
| 7,173,438 B2 | 2/2007 | Pooranakaran et al. |

*Primary Examiner* — Vincent Q Nguyen (57) ABSTRACT

A driver and capacitance measuring circuit includes a voltage source that selectively generates an output voltage at a first node during a driver mode to alter a capacitance of a device that is connected to the first node and that has a variable capacitance. A current source selectively provides one of a charging and discharging current at the first node during a measurement mode. A capacitance calculating circuit samples a voltage at the first node during the measurement node, determines a voltage change rate of the first node during the measurement mode and calculates the capacitance of the device based on the voltage change rate and a value of the one of the charging and discharging current.

21 Claims, 7 Drawing Sheets

ELECTROSTATIC MEMS DRIVER WITH ON-CHIP CAPACITANCE MEASUREMENT FOR AUTOFOCUS APPLICATIONS

FIELD

The present invention relates to capacitance measuring circuits, and more particularly to capacitance measuring circuits for microelectromechanical system (MEMS) devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Figure 1:
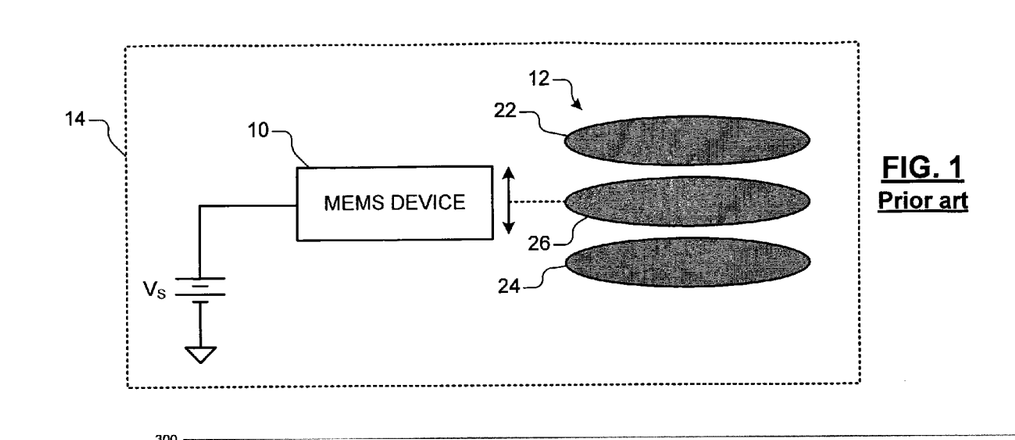
FIG. 1 is a functional block diagram of a driver circuit for a MEMS device that positions a moveable lens of a lens array according to the prior art.

Referring now to FIG. 1, microelectromechanical system (MEMS) devices 10 may be used to adjust the focus of lens arrays 12 in cameras 14. For example, the lens array 12 may include fixed lenses 22 and 24 and a moveable lens 26 arranged therebetween. A position of the moveable lens 26 may be adjusted by an output voltage of a voltage source $V_S$.

While the voltage to displacement of the MEMS device 10 is generally linear, it can be affected by manufacturing variations. Therefore, the amount of voltage corresponding to a predetermined lens position may vary from one camera to another. Capacitance measurement may be used after manufacturing to characterize the response of the MEMS device 10. This kind of measurement typically employs complex electrical measuring devices and other external components.

Figure 2:
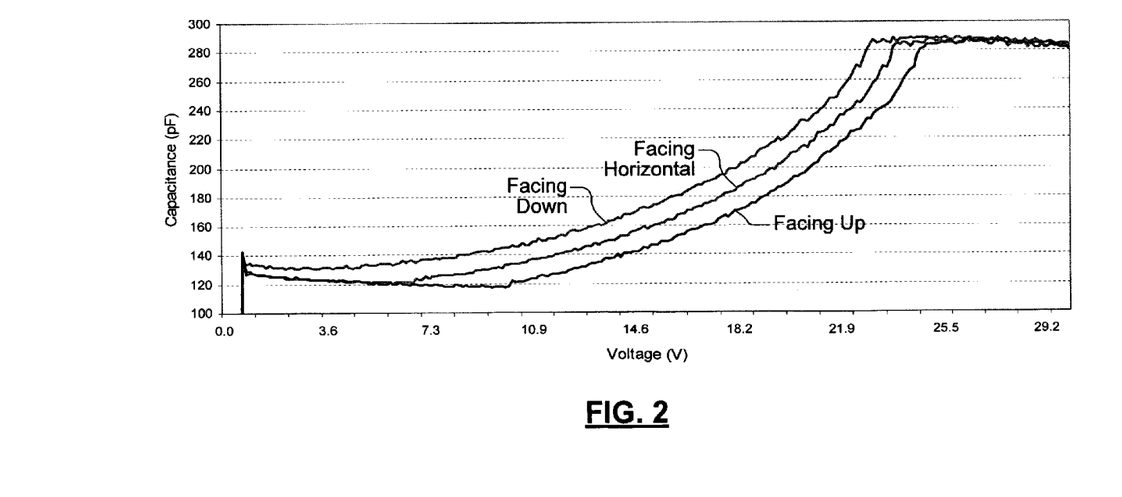
FIG. 2 is a graph showing variation in capacitance of the MEMS device of FIG. 1 relative to applied voltage and orientation.

Referring now to FIG. 2, while manufacturing variations may be accommodated by precise measurement before shipment, other variations cannot. For example, the voltage to displacement relationship can also be affected by gravity (which changes with the orientation). Thus, the voltage to displacement relationship depends upon whether the camera is facing up, down or horizontal. The voltage to displacement relationship also varies with temperature and hysteresis. All of these variations tend to limit the use of the MEMS device 10 in autofocus applications.

Optical measurement systems can be used to measure displacement. However, optical measurement systems are typically difficult to integrate with portable compact cameras. Some conventional capacitance measuring devices apply an AC voltage signal to one electrode of a device and probe the voltage (or current signal) on a second electrode of the device using a known series resistor. The capacitance information can be determined from the amplitude ratio $V_{rms}$.

SUMMARY

A driver and capacitance measuring circuit includes a voltage source that selectively generates an output voltage at a first node during a driver mode to alter a capacitance of a device that is connected to the first node and that has a variable capacitance. A current source selectively provides one of a charging and discharging current at the first node during a measurement mode. A capacitance calculating circuit samples a voltage at the first node during the measurement node, determines a voltage change rate of the first node during the measurement mode and calculates the capacitance of the device based on the voltage change rate and a value of the one of the charging and discharging current.

In other features, the voltage source does not provide the output voltage at the first node during the measurement mode. The current source does not provide the one of the charging and discharging current at the first node during the driver mode.

In other features, the capacitance calculating circuit comprises a controller that communicates with the voltage source and the current source. A first capacitance has one end connected to the first node. An integrating amplifier communicates with another end of the first capacitance. A first comparator compares an output of the integrating amplifier to a first voltage threshold. The controller receives an output of the first comparator.

In other features, the controller selectively resets the integrating amplifier for a period that begins when the measurement mode is started and that ends after a time constant of a series resistance of the device and an input capacitance of the driver and capacitance measuring circuit. The capacitance calculating circuit further comprises a second comparator that compares the output of the integrating amplifier to a second voltage threshold that is different than the first voltage threshold. The controller receives the output of the second comparator and determines the voltage change rate in response to the outputs of the first and second comparators.

In other features, the capacitance calculating circuit further comprises a voltage threshold generating circuit that outputs the first threshold at a first time during the measurement mode. The voltage threshold generating circuit outputs a second voltage threshold that is different than the first voltage threshold to the first comparator at a second time during the measurement mode. The controller receives the output of the first comparator and determines the voltage change rate in response thereto.

In other features, the device comprises a microelectromechanical system (MEMS) device. The MEMS device adjusts a position of a lens of a lens array.

In other features, the capacitance of the device varies with the voltage output. A duration of the measurement mode is less than a mechanical time constant of the device.

In other features, the voltage source varies the voltage output in a first voltage range. The one of the charging and discharging currents adjusts the voltage output by less than 2% of the first voltage range.

A method for driving and measuring capacitance of a device includes generating an output voltage at a first node to alter a capacitance of the device during a driver mode and not outputting the output voltage to the first node during a measurement mode, providing one of a charging and discharging current at the first node during the measurement mode and not outputting the one of the charging and discharging current to the first node during the driver mode, determining a voltage change rate of a voltage at the first node during the measurement mode, and calculating the capacitance of the variable capacitance based on the voltage change rate and a value of the one of the charging and discharging current.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

The present disclosure relates to the measurement of capacitance of a device having a variable capacitance that changes with applied voltage or current to the device. While the present disclosure will be described in conjunction with a MEMS device, the present disclosure applies to the measurement of capacitance of any electronic device having a variable capacitance that changes with applied voltage or current.

The present disclosure enables real-time measurement of capacitance of a MEMS device. The present disclosure allows precise control of the position of the MEMS device (such as the focal distance of a lens array) despite variations in the relationship between MEMS displacement (in other words, lens position) and applied voltage due to manufacturing process variations, orientation, temperature and hysteresis.

In order to operate in real-time, the capacitance measurement should minimize changes to the MEMS position and applied voltage. The capacitance measurement according to the present disclosure applies a constant discharging or charging current at one node and probes the voltage change at the same node. The output voltage, due to the current, changes at a slope or rate that depends on the current and a value of the capacitance at the node.

Figure 3:
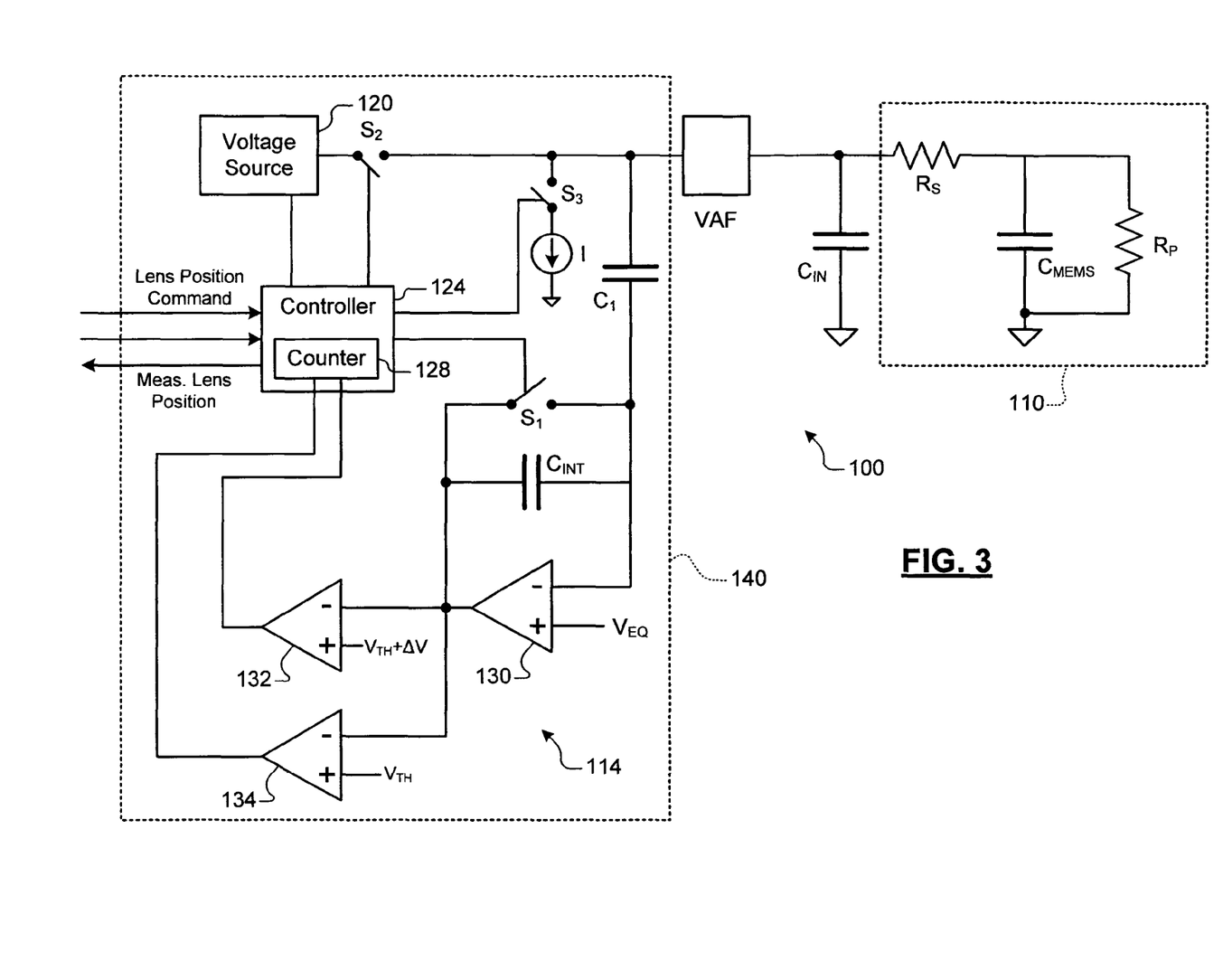
FIG. 3 is a functional block diagram of an exemplary driver and capacitance measuring circuit for a MEMS device according to the present disclosure.

Referring now to FIG. 3, a driver and capacitance measuring circuit 100 for a MEMS device 110 is shown. The MEMS device 110 can be electrically modeled as variable capacitance $C_{MEMS}$, a series resistor $R_S$ and a parallel resistor $R_P$. A capacitance $C_{IN}$ represents the pin capacitance and/or other parasitic capacitance that may be present between the MEMS device 110 and an input pin of the driver and capacitance measuring circuit 100. The driver and capacitance measuring circuit 100 includes a capacitance calculating circuit 104.

The driver and capacitance measuring circuit 100 includes a voltage source 120 that communicates with the MEMS device 110 and generates an applied voltage, which varies a position of the MEMS device 110. For example only, the voltage source 120 may include a charge pump. The capacitance calculating circuit 104 includes a controller 124 that receives a lens command from a camera controller (not shown) and that generates a measured lens position based on the capacitance measurement. The controller 124 may initiate capacitance measurement in response to a measure command signal from the camera controller. Alternately, the controller 124 may independently initiate measurement on an event basis, periodically, or using any other approach. The controller 124 controls a state of switches S1, S2 and S3 to selectively measure the capacitance of the MEMS device, as will be described below. The controller 124 includes a counter 128.

The capacitance calculating circuit 104 further includes a capacitance $C_1$ that has one end connected to the MEMS device 110 and another end connected to the switch S1, a capacitance $C_{INT}$ and an inverting input of an integrating amplifier 130. The non-inverting input of the integrating amplifier 130 receives a voltage reference $V_{EQ}$.

An output of the integrating amplifier 130 is input to first inputs of comparators 132 and 134. A second input of the comparator 134 receives a first threshold voltage $V_{TH}$. A second input of the comparator 132 receives a second threshold voltage $V_{TH}+\Delta V$. Outputs of the comparators 132 and 134 are input to the counter 128. One of the outputs of the comparators 134 and 136 starts the counter 128 and the other one of the outputs of the comparators 132 and 134 stops the counter 128, as will be described further below.

The driver and capacitance measuring circuit 100 further includes a current source I. The switch S2 selectively disconnects the voltage source 120 during capacitance measurement to provide high impedance. The switch S3 selectively closes during capacitance measurement to provide a discharge current to the MEMS device 10.

As can be appreciated, the current source I can also provide a charging current. Components of the driver and capacitance measuring circuit 100 can be implemented as an integrated circuit. The MEMS device 110 may be connected to system ground and to the driver and capacitance measuring circuit via a single pin.

In use, the driver and capacitance measuring circuit 100 operates in a driver mode and a measuring mode. During the driver mode, the switch S2 is closed, the switch S3 is open and the switch S1 is closed. Therefore, the current source I does not provide discharge (or charging) current during the driver mode. The voltage source 120 communicates with the controller 124 and provides the appropriate applied voltage to the MEMS device based on the lens position command.

When the measuring mode is initiated, the switch S2 is opened and the switch S3 is closed to provide the discharge (or charging) current. After a predetermined period greater than a time constant of $R_S$ and $C_{IN}$, the switch S1, that was resetting $C_{INT}$, may be opened. The comparator 134 generates a start signal to the counter 128 when the voltage increases above $V_{TH}$. The comparator 132 generates a stop signal when the voltage increases above $V_{TH}+\Delta V$. The controller 124 calculates the position of the MEMS device 110 based on the time difference between the start and stop signals, the voltage difference ΔV, and a value of the discharge (or charging) current.

For example only, the variable capacitance $C_{MEMS}$ may have a value from 50 pF to 700 pF depending on displacement. The series resistor $R_S$ may have a value of 0Ω to 200 kΩ. The parallel resistor $R_P$ is typically a very high resistance such as a resistance greater than 100 MΩ. As can be appreciated, other values may be used in a particular application.

The capacitance value of $C_{MEMS}$ depends on the DC voltage applied to the MEMS device 110. Any change in voltage applied to the MEMS device 110 that is comparable to the mechanical time constant of the MEMS device (typically ~10 ms) will cause MEMS movement. In order to measure capacitance (and displacement) information in a real-time application, the capacitance measurement method should minimize disturbance of the position of the MEMS device. According to the present invention, a capacitance test signal is applied during a short period (<<10 ms) and has a small amplitude (typically <a few Volts).

The capacitance measurement can be obtained by measuring the time required for a fixed voltage drop. In other words, the measured capacitance is equal to:

$$I*time/\Delta V,$$

Where I is the discharge current, time is the time difference between start and stop signals and voltage drop is ΔV. Thus, the capacitance is related to an inverse of a voltage change rate or ΔV/time.

The value of the discharging (or charging) current can be adjusted to fit the capacitance range needed and to keep the pulse duration shorter than the mechanical time constant of the MEMS device 110. Using a small voltage drop of 0.5V, typical values include a discharge current of 16 μA, a voltage difference of less than 0.5V, and a time difference of approximately 25 μs.

During the driver mode, the voltage source 120 outputs a desired DC voltage. When the capacitance measurement starts, the voltage source 120 is disconnected (or goes to a high impedance state) and the discharge current is applied to the MEMS device 110. The voltage on the node is probed with a small capacitance C1 and amplified by the integrating amplifier 130 using a gain (for example only, approximately 2 or 3). In another implementation the amplifier 130 and capacitance $C_{INT}$ can be removed and in that case the gain is 1. The output of the integrating amplifier 130 drives the matched comparators 134 and 132 that provide the start and the stop signals to the counter 128, respectively. After the stop signal is reached, the driver and capacitance measuring device 100 restores the driver mode, removes the discharge current and re-activates the voltage source 120 to restore the correct DC level on the output.

In conventional capacitance measuring applications, a series resistance of the MEMS device generally has a significant impact on the measurement method. The series resistance limits a frequency of the applied voltage and/or accuracy. Using the capacitance measurement approach according to the present disclosure, the effect of the series resistor can be easily compensated by inserting a delay of few μs before activating the comparators 132 and 134.

The series resistor connected to the pin capacitance $C_{IN}$ generates an RC delay between the current signal applied to the MEMS capacitance and the probed signal. Since the input pin capacitance $C_{IN}$ is relatively small (on the order of tens of pF), the effect of series resistance $R_S$ (on the order of tens of kΩ) can be easily accommodated using a delay of a few μs. In conventional measuring methods, the RC delay is generated by the series resistor $R_S$ and the MEMS capacitance (up to 800 pf). Therefore, the delay would need to be 10 times longer, which may pose problems relative to the mechanical time constant of the MEMS device 110.

Figure 4:
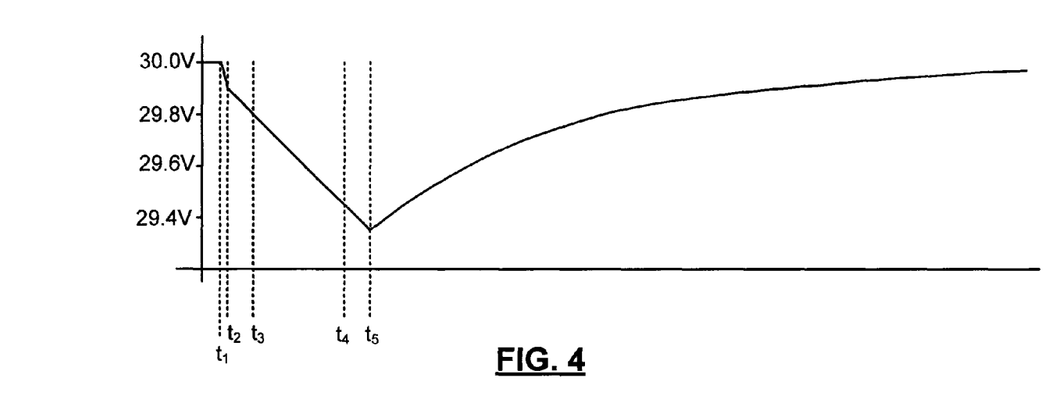
FIG. 4 is a graph showing applied voltage during capacitance measurement of an exemplary MEMS device.

Referring now to FIG. 4, a graph showing voltage across the MEMS device 110 during capacitance measurement is shown. Before time t1, the applied voltage is at 30V. When the capacitance measurement begins at time t1, the switch S2 is opened and the switch S3 is closed. The current source provides a discharge (or charge) current. After a time constant of $R_S$ and $C_{IN}$, the switch S1 is opened just after time t2. The comparator generates the start signal at time t3 and the comparator generates the stop signal at t4. At time t5, the switch S3 is opened, the switch S2 is closed and the switch S1 is closed.

As can be appreciated, in the example of FIG. 4 the capacitance measurement decreased the applied voltage on the MEMS device 110 by less than 0.5V for a period less 100 μs. Since the MEMS device 110 has a time constant that is greater than the measurement period, the displacement of the MEMS device 110 during the test is minimized. In this example, the operating point is adjusted by 0.5V over a 30V range or less than 2% of the voltage range.

Figure 5:
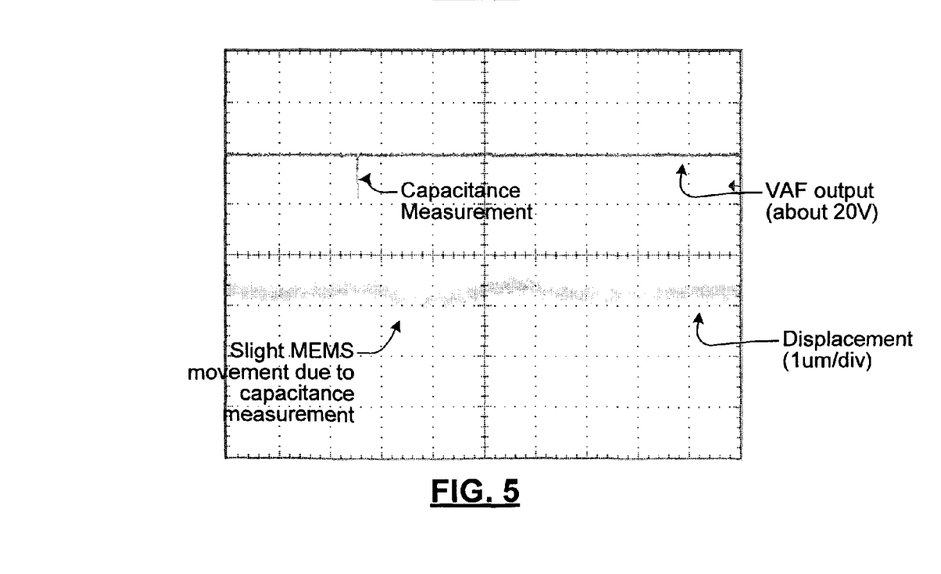
FIG. 5 is a graph showing displacement of the MEMS device during capacitance measurement.

Referring now to FIG. 5, a graph showing displacement of the MEMS device 110 during capacitance measurement is shown. With an initial applied voltage of 20V, the capacitance measurement causes a slight movement of the MEMS device 110 of approximately 0.3 μm, which is an acceptable amount of movement.

Figure 6:
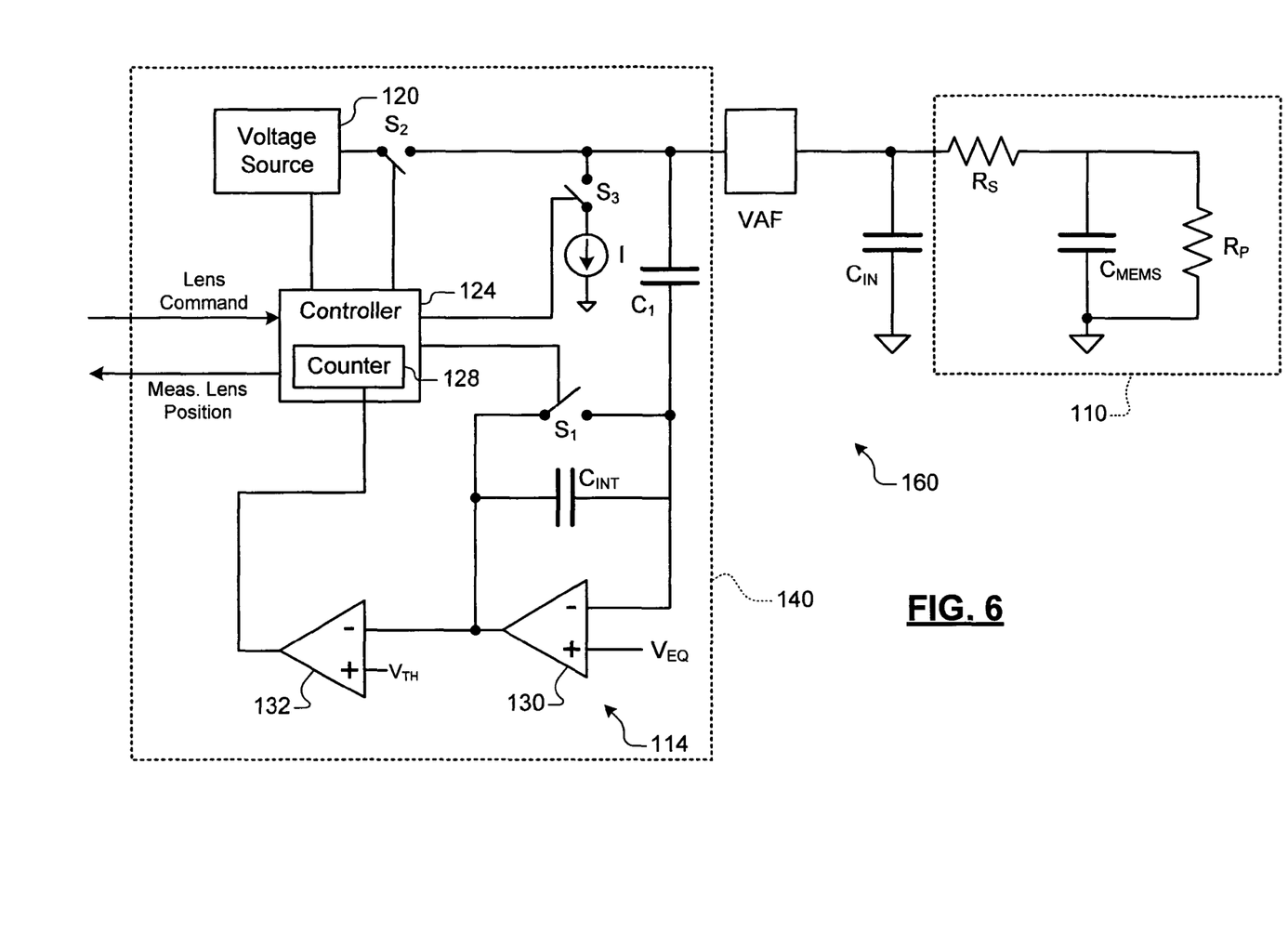
FIG. 6 is a functional block diagram of another exemplary driver and capacitance measuring circuit for a MEMS device according to the present disclosure.

Referring now to FIG. 6, another driver and capacitance measuring circuit 160 for the MEMS device 110 is shown. The driver and capacitance measuring circuit 160 operates in a similar manner as shown in FIG. 3. However, only a single comparator 132 is used. In this implementation, the start of the counter 128 may be initiated when the capacitance measurement is initiated (or a predetermined period thereafter). Then, the stop signal is generated when the output of the integrating amplifier 130 is greater than the threshold $V_{TH}$. Some compensation for the RC delay may be estimated and accommodated in the capacitance calculation.

Figure 7:
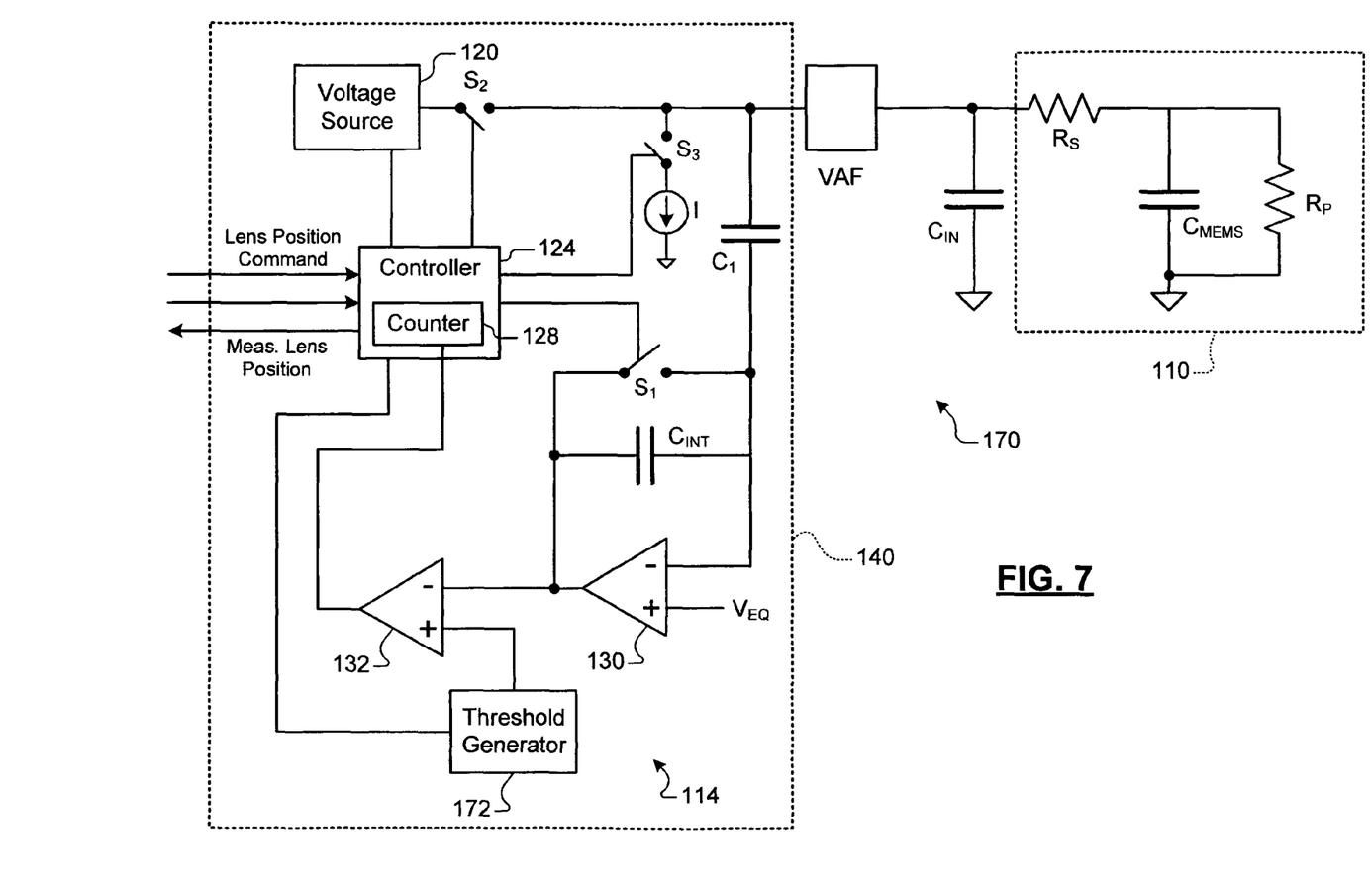
FIG. 7 is a functional block diagram of another exemplary driver and capacitance measuring circuit for a MEMS device according to the present disclosure.

Referring now to FIG. 7, another driver and capacitance measuring circuit 170 for the MEMS device 110 is shown. The driver and capacitance measuring circuit 170 operates in a similar manner as shown in FIG. 3. However, only a single comparator 132 is used. A threshold generator 172 generates the first voltage threshold $V_{TH}$. When the start signal is generated, the threshold generator 172 switches to the second voltage threshold $V_{TH}+\Delta V$. The output of the comparator 132 is used to start and stop the counter 128. The controller 124 may trigger the threshold generator 172 to switch between the first and second thresholds.

Figure 8:
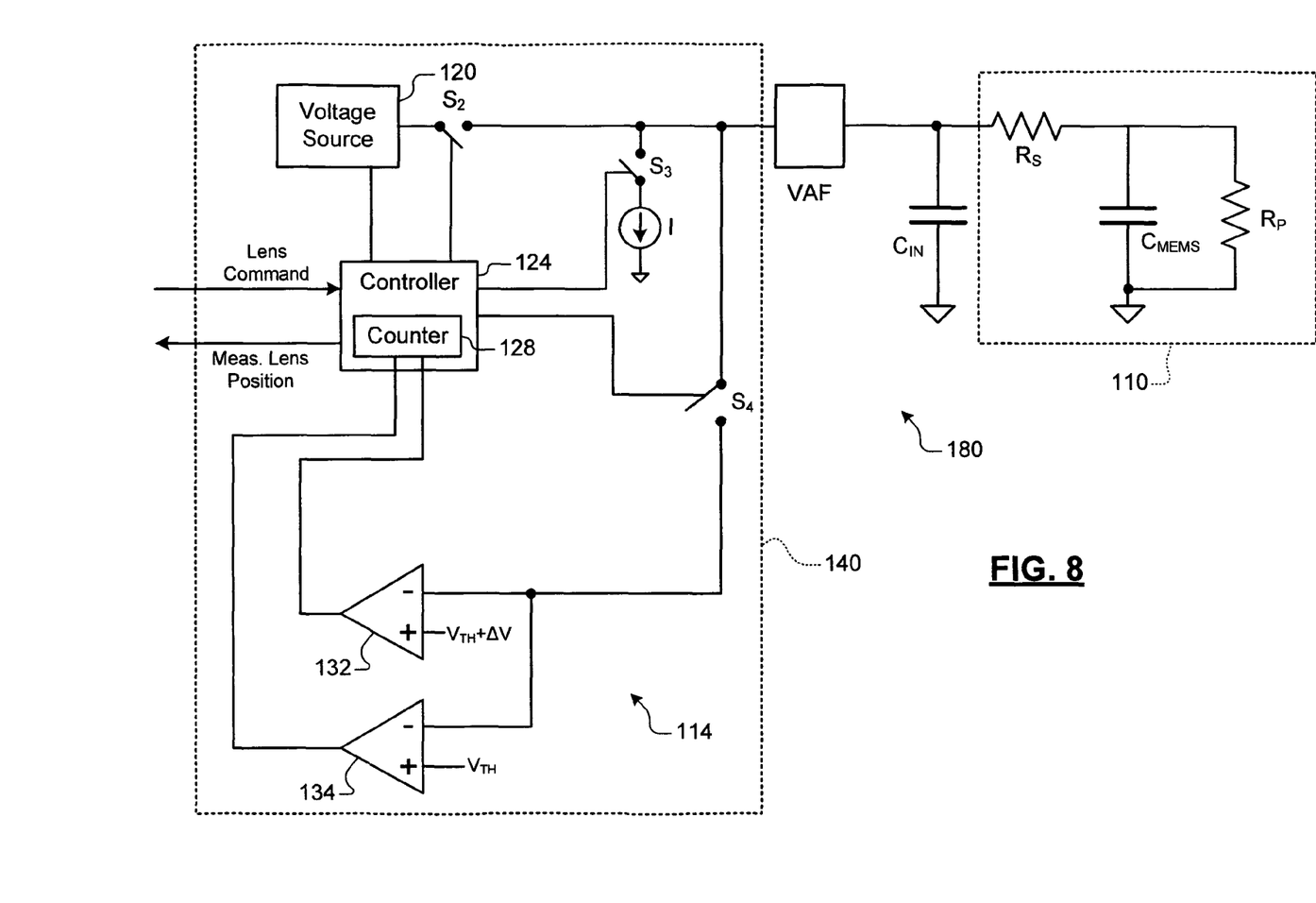
FIG. 8 is a functional block diagram of another exemplary driver and capacitance measuring circuit for a MEMS device according to the present disclosure.

Referring now to FIG. 8, another driver and capacitance measuring circuit 180 for the MEMS device 110 is shown. The driver and capacitance measuring circuit 180 operates in a similar manner as shown in FIG. 3. However, the integrating amplifier 130 and related elements are removed. In this case, higher voltage thresholds are input to the comparators 132 and 134, which start and stop the counter 128.

As can be appreciated, other variations and combinations of the features in FIGS. 3 and 6-8 are contemplated.

Figure 9:
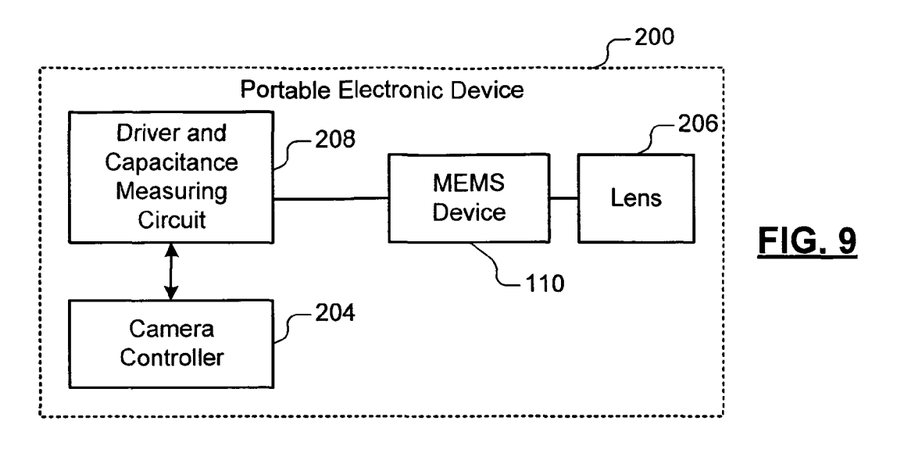
FIG. 9 is a functional block diagram of a portable electronic device including the driver and capacitance measuring circuit.

Referring now to FIG. 9, a portable electronic device 200 includes a camera controller 204 that generates lens position commands for the driver and capacitance measuring circuit 208. The portable electronic device 200 may comprise a camera, a portable digital assistant, a smartphone, cell phone or other device. The driver and capacitance measuring circuit 208 positions a lens 206 by generating an applied voltage to the MEMS device 110. The driver and capacitance measuring circuit 208 measures a capacitance of the MEMS device as described herein and generates measured lens position information for the camera controller 204.

Figure 10:
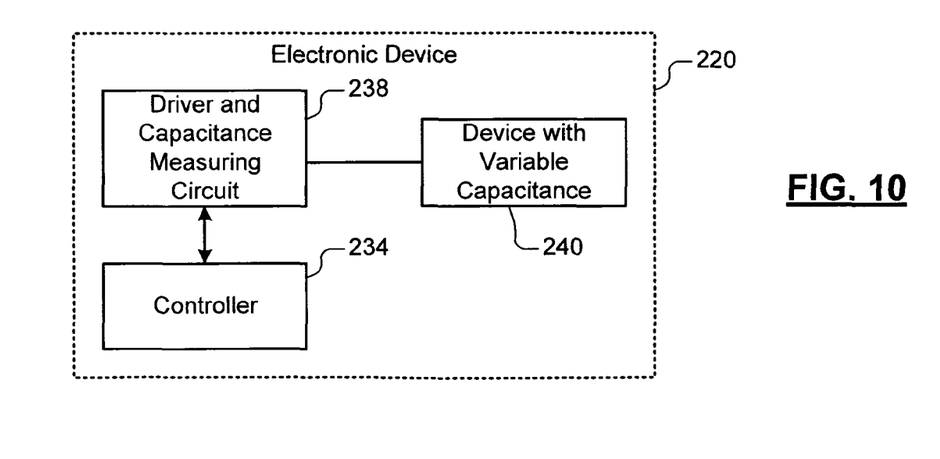
FIG. 10 is a functional block diagram of an electronic device including the driver and capacitance measuring circuit.

Referring now to FIG. 10, an electronic device 220 includes a controller 234 that generates device command for a driver and capacitance measuring circuit 238. The driver and capacitance measuring circuit 238 controls a device 240 having a variable capacitance by generating an applied voltage or current based on the command. The capacitance of the device 240 varies with the applied voltage or current. The driver and capacitance measuring circuit 238 measures the capacitance of the device 240 as described herein and generates and outputs the measured capacitance to the controller 234.

Some of the advantages of the capacitance measuring approach described herein include both driving and measuring the MEMS device 110 using a single pin. The other electrode of the MEMS device 110 can be connected to system ground. In addition, the measurement can be done in real time without any external measuring components or instruments. The driver and capacitance measuring circuit can be arranged close to the MEMS device 110 inside a camera. As a result, parasitic capacitance due to a long conductor or printed circuit board can be minimized. The driver and capacitance measuring circuit adds very low parasitic capacitance. Compensation for the effect of the series resistance ($R_S$) of the MEMS device can be accommodated in the capacitance measurement using a delay before activating the start and stop comparators.

The use of the integrating amplifier 130 allows a very small signal drop on the output, which minimizes disturbance of the position of the MEMS device 110. Since the capacitance measurement is very fast and minimizes disturbance, real-time control of MEMS displacement can be performed despite hysteresis and changes in MEMS orientation.

The driver and capacitance measuring circuit can automatically implement capacitance measurement after every transition or at a given refresh frequency. Alternately, the driver and capacitance measuring circuit can directly control and configure the MEMS displacement using a closed loop approach.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A driver and capacitance measuring circuit, comprising:
   a voltage source that selectively generates an output voltage at a first node during a driver mode to alter a capacitance of a device that is connected to the first node and that has a variable capacitance;
   a current source that selectively provides one of a charging and discharging current at the first node during a measurement mode;
   a capacitance calculating circuit that samples a voltage at the first node during the measurement mode, that determines a voltage change rate of the first node during the measurement mode and that calculates the capacitance of the device based on the voltage change rate and a value of the one of the charging and discharging current.

2. The driver and capacitance measuring circuit of claim 1, wherein:
   the voltage source does not provide the output voltage at the first node during the measurement mode; and
   the current source does not provide the one of the charging and discharging current at the first node during the driver mode.

3. The driver and capacitance measuring circuit of claim 1, wherein the capacitance calculating circuit comprises:
   a controller that communicates with the voltage source and the current source;
   a first capacitance having one end connected to the first node;
   an integrating amplifier that communicates with another end of the first capacitance; and
   a first comparator that compares an output of the integrating amplifier to a first voltage threshold,
   wherein the controller receives an output of the first comparator.

4. The driver and capacitance measuring circuit of claim 3, wherein the controller selectively resets the integrating amplifier for a period that begins when the measurement mode is started and that ends after a time constant of a series resistance of the device and an input capacitance of the driver and capacitance measuring circuit.

5. The driver and capacitance measuring circuit of claim 3, wherein:
   the capacitance calculating circuit further comprises a second comparator that compares the output of the integrating amplifier to a second voltage threshold that is different than the first voltage threshold; and
   the controller receives the output of the second comparator and determines the voltage change rate in response to the outputs of the first and second comparators.

6. The driver and capacitance measuring circuit of claim 3, wherein:
   the capacitance calculating circuit further comprises a voltage threshold generating circuit that outputs the first threshold at a first time during the measurement mode and a second voltage threshold that is different than the first voltage threshold to the first comparator at a second time during the measurement mode; and
   the controller receives the output of the first comparator and determines the voltage change rate in response thereto.

7. The driver and capacitance measuring circuit of claim 1, wherein the device comprises a microelectromechanical system (MEMS) device.

8. The driver and capacitance measuring circuit of claim 7, wherein the MEMS device adjusts a position of a lens of a lens array.

9. The driver and capacitance measuring circuit of claim 1, wherein:
   the capacitance of the device varies with the voltage output; and
   a duration of the measurement mode is less than or equal to a mechanical time constant of the device.

10. The driver and capacitance measuring circuit of claim 9, wherein:
    the voltage source varies the voltage output in a first voltage range; and
    the one of the charging and discharging currents adjusts the voltage output by less than 2% of the first voltage range.

11. A driver and capacitance measuring circuit, comprising:
    a voltage source that selectively generates an output voltage at a first node during a driver module to alter a position and capacitance of a microelectromechanical system (MEMS) device and that does not provide the output voltage at the first node during a measurement mode;

a current source that selectively provides one of a charging and discharging current at the first node during the measurement mode and that does not provide the one of the charging and discharging current at the first node during the driver mode; and a capacitance calculating circuit that samples a voltage at the first node during the measurement mode, that determines a voltage change rate of the first mode during the measurement mode and that calculates the capacitance of the device based on the voltage change rate and a value of the one of the charging and discharging current.

12. The driver and capacitance measuring circuit of claim 11, wherein the capacitance calculating circuit comprises:
   a controller that communicates with the voltage source and the current source;
   a first capacitance having one end connected to the first node;
   an integrating amplifier that communicates with another end of the first capacitance; and
   a first comparator that compares an output of the integrating amplifier to a first voltage threshold,
   wherein the controller receives an output of the first comparator.

13. The driver and capacitance measuring circuit of claim 12, wherein the controller selectively resets the integrating amplifier for a period that begins when the measurement mode is started and that ends after a time constant of a series resistance of the device and an input capacitance of the driver and capacitance measuring circuit.

14. The driver and capacitance measuring circuit of claim 12, wherein:
   the capacitance calculating circuit further comprises a second comparator that compares the output of the integrating amplifier to a second voltage threshold that is different than the first voltage threshold; and
   the controller receives the output of the second comparator and determines the voltage change rate in response to the outputs of the first and second comparators.

15. The driver and capacitance measuring circuit of claim 12, wherein:
   the capacitance calculating circuit further comprises a voltage threshold generating circuit that outputs the first threshold at a first time during the measurement mode and a second voltage threshold that is different than the first voltage threshold to the first comparator at a second time during the measurement mode; and
   the controller receives the output of the first comparator and determines the voltage change rate in response thereto.

16. The driver and capacitance measuring circuit of claim 11, wherein the MEMS device adjusts a position of a lens of a lens array.

17. The driver and capacitance measuring circuit of claim 11, wherein:
   the capacitance of the MEMS device varies with the voltage output;
   a duration of the measurement mode is less than a mechanical time constant of the MEMS device;
   the voltage source varies the voltage output in a first voltage range; and
   the one of the charging and discharging currents adjusts the voltage output by less than 2% of the first voltage range.

18. A method for driving and measuring capacitance of a device, comprising:
   generating an output voltage at a first node to alter a capacitance of the device during a driver mode and not outputting the output voltage to the first node during a measurement mode;
   providing one of a charging and discharging current at the first node during the measurement mode and not outputting the one of the charging and discharging current to the first node during the driver mode;
   determining a voltage change rate of a voltage at the first node during the measurement mode; and
   calculating the capacitance based on the voltage change rate and a value of the one of the charging and discharging current.

19. The method of claim 18, wherein the device comprises a microelectromechanical system (MEMS) device that adjusts a position of a lens of a lens array.

20. The method of claim 18, wherein:
   the capacitance of the device varies with the voltage output;
   a duration of the measurement mode is less than or equal to a mechanical time constant of the device.

21. The method of claim 18, further comprising varying voltage source varies the voltage output in a first voltage range, wherein:
   the one of the charging and discharging currents adjusts the voltage output by less than 2% of the first voltage range.

* * * * *

UNITED STATES PATENT AND TRADEMARK OFFICE
CERTIFICATE OF CORRECTION

PATENT NO. : 8,188,755 B2  Page 1 of 1
APPLICATION NO. : 12/685992
DATED : May 29, 2012
INVENTOR(S) : Alini et al.

It is certified that error appears in the above-identified patent and that said Letters Patent is hereby corrected as shown below:

Column 10, Line 40   Delete "voltage source varies"

Signed and Sealed this
Twenty-second Day of January, 2013

David J. Kappos
*Director of the United States Patent and Trademark Office*